(12) United States Patent
Hong et al.

(10) Patent No.: US 9,337,526 B2
(45) Date of Patent: May 10, 2016

(54) ANTENNA-PRINTED CIRCUIT BOARD PACKAGE

(75) Inventors: Won-bin Hong, Seoul (KR); Alexander Goudelev, Suwon-si (KR); Kwang-hyun Baek, Anseong-si (KR); Young-hwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 13/534,542

(22) Filed: Jun. 27, 2012

(65) Prior Publication Data

US 2013/0099006 A1 Apr. 25, 2013

(30) Foreign Application Priority Data

Oct. 19, 2011 (KR) .................. 10-2011-0107060

(51) Int. Cl.
*G06K 19/06* (2006.01)
*H01Q 1/22* (2006.01)

(52) U.S. Cl.
CPC ...... *H01Q 1/2283* (2013.01); *H01L 2223/6677* (2013.01); *H01L 2224/16225* (2013.01)

(58) Field of Classification Search
USPC .......................................................... 235/492
See application file for complete search history.

(56) References Cited

U.S. PATENT DOCUMENTS

| | | |
|---|---|---|
| 5,798,567 A | 8/1998 | Kelly et al. |
| 6,770,955 B1 | 8/2004 | Coccioli et al. |
| 7,518,229 B2 | 4/2009 | Cotte et al. |
| 7,545,329 B2 | 6/2009 | Gaucher et al. |
| 7,675,465 B2* | 3/2010 | Doan ................. H01Q 1/38 343/700 MS |
| 7,808,798 B2 | 10/2010 | Cotte et al. |
| 7,852,281 B2 | 12/2010 | Choudhury |
| 2008/0023810 A1* | 1/2008 | Yamazaki ...... G06K 19/077258 257/679 |
| 2009/0322643 A1* | 12/2009 | Choudhury ......... H01Q 1/2291 343/851 |
| 2010/0327068 A1* | 12/2010 | Chen ............... G06K 19/07749 235/492 |

FOREIGN PATENT DOCUMENTS

JP 9237867 A 9/1997

\* cited by examiner

*Primary Examiner* — Michael G Lee
*Assistant Examiner* — David Tardif
(74) *Attorney, Agent, or Firm* — Sughrue Mion, PLLC

(57) ABSTRACT

An antenna-printed circuit board (PCB) package is provided. The antenna-PCB package includes a PCB; an antenna portion formed on an upper surface of the PCB and inside the PCB; and a radio frequency integrated circuit (RFIC) chip bonded to a lower surface of the PCB.

26 Claims, 6 Drawing Sheets

ANTENNA-PRINTED CIRCUIT BOARD PACKAGE

CROSS-REFERENCE TO RELATED PATENT APPLICATION

This application claims priority from Korean Patent Application No. 10-2011-0107060, filed on Oct. 19, 2011, in the Korean Intellectual Property Office, the disclosure of which is incorporated by reference herein in its entirety.

BACKGROUND

1. Field

Apparatuses, device, and articles of manufacture consistent with the present inventive concept relate to a package including an antenna, a radio frequency integrated circuit (RFIC), and a printed circuit board (PCB), for millimeter band communication.

2. Description of the Related Art

Millimeter band communication, which is being developed for transmission of large capacity audio/video (AV) data at high speeds on the order of gigabits per second (GBps), is capable of transmitting large capacity data several times faster than near field or middlefield communication methods such as Wireless Fidelity (WiFi), wireless local area network (WLAN), wireless personal area network (WPAN), etc.

Currently, 60 GHz band communication is competing with several forums and standards such as World in HD (WiHD), Wireless Giga Alliance (WiGig), and IEEE 802.11ad for commercialization.

SUMMARY

Exemplary embodiments provide a package including an antenna, a radio frequency integrated circuit (RFIC), and a circuit board, for millimeter band communication, wherein a combining process of the antenna, the RFIC, and the circuit board is simplified.

According to an aspect of an exemplary embodiment, there is provided an antenna-PCB package including: a PCB; an antenna portion formed over an upper surface of the PCB and inside the PCB; and an RFIC chip bonded to a lower surface of the PCB.

The antenna portion may comprise a patch antenna that irradiates a wireless signal; and a signal line, through which a signal to be irradiated by the patch antenna is transmitted from the RFIC chip to the patch antenna.

The patch antenna may be configured to irradiate a millimeter waveband signal, and may comprise at least two planar patterns.

A signal from the RFIC chip may be supplied through the signal line to the patch antenna using a direct feeding method.

A signal from the RFIC chip may be supplied to the patch antenna through the signal line using a coupling feeding method.

The signal line may have a stripline structure or a microstrip structure or an embedded coplanar waveguide (CPW) line structure.

The antenna-PCB package may further comprise a plurality of RFIC bonding pads formed on a lower surface of the PCB, and the RFIC may be bonded to the PCB using the bonding pads.

The RFIC chip may be bonded to the RFIC bonding pads using a flip-chip bonding method or a wire bonding method. The RFIC chip may be bonded to the RFIC bonding pads using a flip chip bonding method by using C4.

A power line for supplying power to the RFIC chip may be formed in the PCB. The antenna-PCB package may further comprise a conductive via that electrically connects the power line and one of the plurality of RFIC bonding pads.

A plurality of grounding layers and at least one ground via that connects the plurality of grounding layers may be formed in the PCB.

The PCB may comprise an FR4 material.

The antenna-PCB package may further comprise a heat sink bonded to the PCB.

BRIEF DESCRIPTION OF THE DRAWINGS

The above and/or other aspects will become more apparent by describing in detail exemplary embodiments with reference to the attached drawings in which.

DETAILED DESCRIPTION

Figure 1:
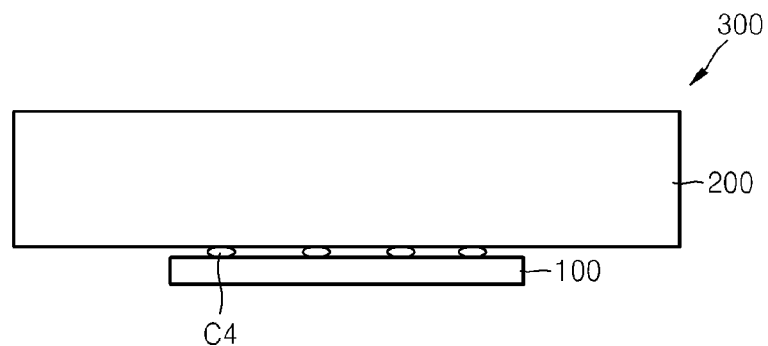
FIG. 1 is a schematic cross-sectional view of an antenna-PCB package according to an exemplary embodiment.

Exemplary embodiments will now be described more fully with reference to the accompanying drawings. In the drawings, like reference numerals denote like elements, and the sizes of elements are exaggerated for clarity and convenience.

Figure 2:
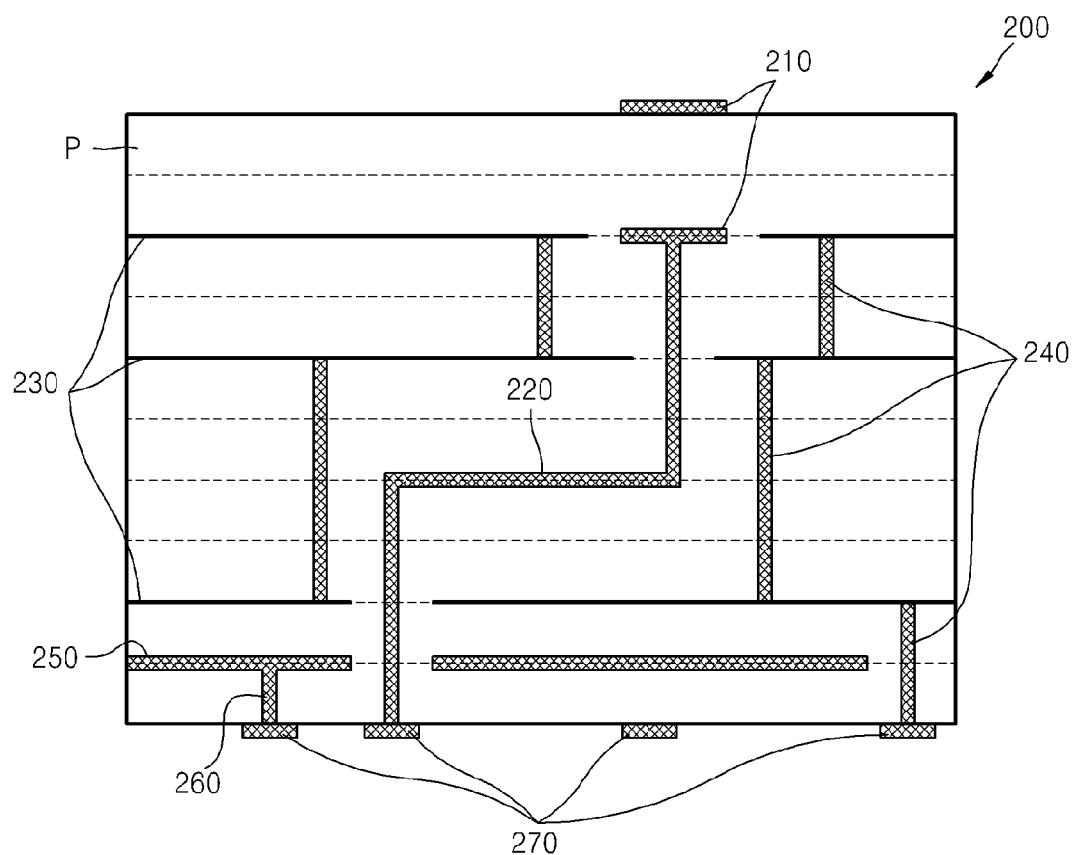
FIG. 2 is a cross-sectional view illustrating a specific configuration of a PCB unit applied to the antenna-PCB package of FIG. 1 according to an exemplary embodiment.

FIG. 1 is a schematic cross-sectional view of an antenna-printed circuit board (PCB) package according to an exemplary embodiment. FIG. 2 is a cross-sectional view illustrating a specific configuration of a PCB unit applied to the antenna-PCB package of FIG. 1 according to an exemplary embodiment.

Referring to FIG. 1, the antenna-PCB package 300 includes a PCB unit 200 and a radio frequency integrated circuit (RFIC) chip 100 bonded to the PCB unit 200. The RFIC chip 100 is bonded to the PCB unit 200 using, for example, C4 by flip-chip bonding. However, the bonding method is not limited thereto, and the RFIC chip 100 may be bonded to the PCB unit 200 by using wire bonding or other surface mounting methods.

Compared to conventional, commercial low-frequency bands, in super high frequency bands such as a millimeter band an antenna, a radio frequency integrated circuit (RFIC), and a circuit board are typically individually designed and separately manufactured in order to provide respective performances thereof in the super high frequency bands. Thus, in super high frequency bands, a package is usually assembled from the separately manufactured antenna, RFIC, and circuit board. In the related art the antenna is bonded to the RFIC in a final process using a surface mounting method such as a flip-chip bonding method or a wire bonding method, and then the combined antenna-RFIC bond is bonded to the circuit board using surface mount technology (SMT) such as a ball grid array (BGA), a land grid array (LGA), etc.

Other technologies such as On-Chip antenna package technology in which an antenna and an RFIC having the same silicon properties are manufactured have been examined in academia. However, due to low-resistivity silicon properties applied to prevent a latch up in a complementary metal oxide semiconductor (CMOS) process, irradiation efficiency of the antenna is very low, and thus it is difficult to commercialize the On-Chip antenna packages.

By contrast, the PCB unit 200 has a structure in which an antenna portion and signal wiring for wireless communication are mounted in a PCB P. This structure allows omission of an assembly process of a ball grid array (BGA) or a land grid array (LGA) which is used to bond an antenna, which is separately manufactured from the PCB P, with the PCB P, and allows that a physical distance between the antenna and the PCB P is minimized.

If the antenna is formed of a different material from the PCB P, a BGA or a LGA process is used to combine the two elements electrically and physically. However, the BGA or LGA process is a high level assembly technique using considerable time and costs. Also, it is impossible for an operator to test the elements using only eyesight in a testing process after the antenna and the PCB P are assembled, and thus X-rays are used, which increases costs. In addition, a long physical distance between the antenna and the PCB P, such as that generated when using a BGA or LGA process, causes attenuation loss of signals, and also causes parasitic inductance and capacitance in a super high frequency band. Also, if the distance between the antenna and the PCB P is long, a heat transmission path is required, and this is thermodynamically disadvantageous. By contrast, the PCB unit 200 according to the current exemplary embodiment includes an antenna and a signal wiring on a PCB so as to improve high frequency performance and implement a compact package at the same time.

A detailed configuration of the PCB unit 200 will be described with reference to FIG. 2.

The PCB P has a structure in which a plurality of conductive plates are electrically separated and structurally supported by a dielectric layer also stacked with the conductive plates. The PCB P allows electrical connection between electronic products to be implemented with high density, low costs, high reliability, and high productivity. Referring to FIG. 2, dotted lines denote boundaries between a plurality of dielectric layers. A plurality of grounding layers 230 and a plurality of ground vias 240 that connect the plurality of grounding layers 230 are formed in the PCB P. The positions and number of the ground vias 240 are exemplary and are not limited to those illustrated in FIG. 2.

The antenna portion is formed o an upper surface of the PCB P and inside the PCB P and includes, for example, a patch antenna 210 and a signal line 220. The patch antenna 210 irradiates a wireless signal and is configured to have a pattern suitable for a signal frequency. For example, the patch antenna 210 may be configured to irradiate a millimeter waveband signal. The patch antenna 210 may be configured to include at least two layers of planar patterns, and is not limited to the illustrated two-layer structure. Also, the patch antenna 210 may have an array structure including a plurality of antennas. Through the signal line 220, a signal to be irradiated by using the patch antenna 210 is transmitted from the RFIC chip 100. The signal line 220 illustrated in FIG. 2 is in the form of a stripline; that is, the grounding layers 230 are formed on and under the signal line 220, and a signal may be transmitted in a transverse electro magnetic (TEM) mode via the signal line 220 and the grounding layers 230. Also, a signal is supplied from the RFIC chip 100 to the patch antenna 210 via a direct feeding method.

A plurality of RFIC bonding pads 270 may be formed on a lower surface of the PCB P, and the positions or number of the RFIC bonding pads 270 is not limited to those illustrated in FIG. 2. The RFIC chip 100 may be bonded to the RFIC bonding pads 270 using a flip-chip bonding or a wire bonding method, and as illustrated in FIG. 1, may be bonded using C4.

A power line 250 through which power is supplied to the RFIC chip 100 may be further included in the PCB P; the power line 250 may be connected to the RFIC bonding pads 270 via a conductive via 260.

As described above, the PCB unit 200 in which the patch antenna 210, the signal line 220, the power line 250, and the grounding layers 230 are mounted may also be manufactured using a FR4-based PCB process by which typical PCBs are manufactured.

Figure 3:
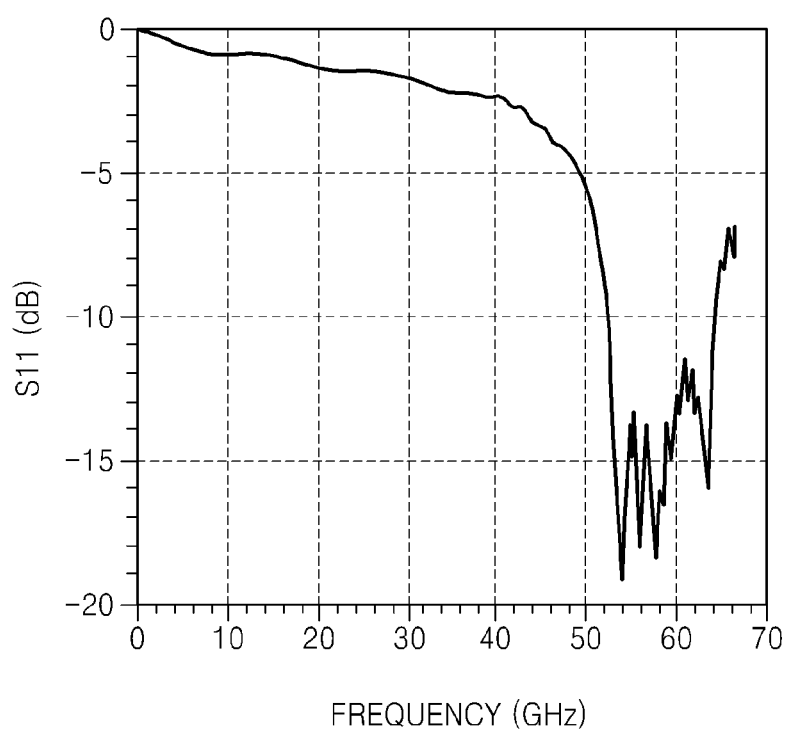
FIG. 3 is a graph showing antenna frequency band performance of the antenna-PCB package of FIG. 1.
Figure 4:
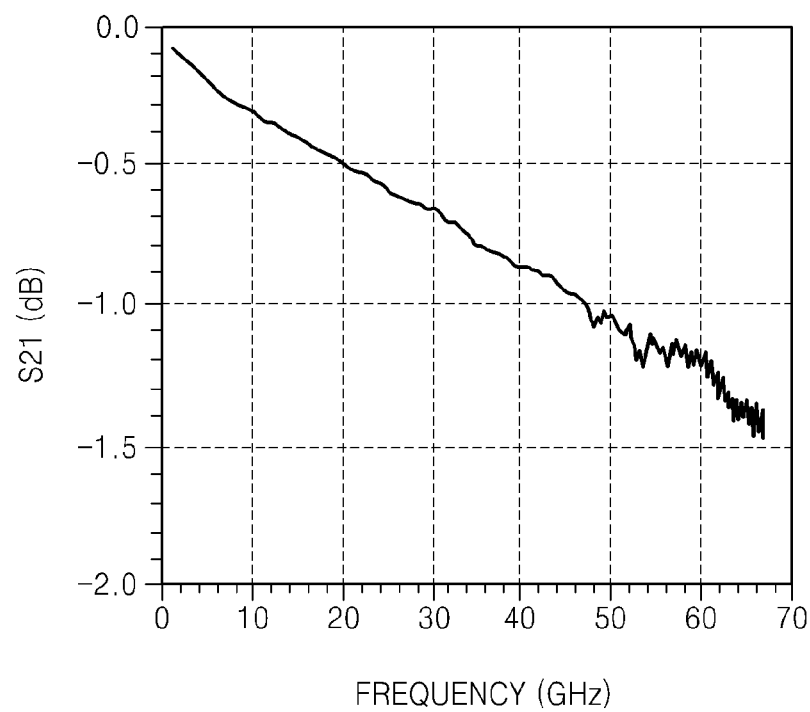
FIG. 4 is a S21 graph showing signal loss of the antenna-PCB package of FIG. 1.

FIG. 3 is a S11 graph showing antenna frequency band performance of the antenna-PCB package 300 of FIG. 1. FIG. 4 is a S21 graph showing signal loss of the antenna-PCB package 300 of FIG. 1. Referring to FIGS. 3 and 4, a bandwidth of about −10 dB or less shown in the graph of S11 and loss shown in the graph of S21 satisfy the 60 GHz communication specifications.

Figure 5:
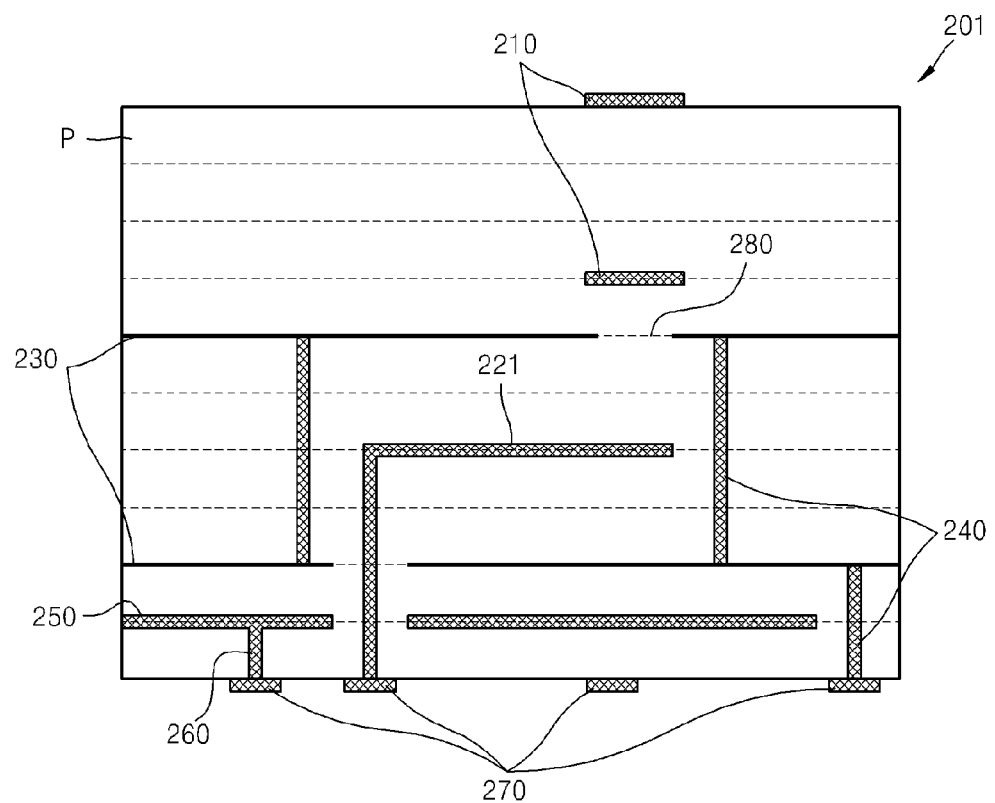
FIG. 5 is a cross-sectional view illustrating a specific configuration of a PCB unit applied to the antenna-PCB package of FIG. 1 according to another exemplary embodiment.

FIG. 5 is a cross-sectional view illustrating a specific configuration of a PCB unit applied to the antenna-PCB package of FIG. 1 according to another exemplary embodiment.

The PCB unit 201 is different from the PCB unit 200 of FIG. 1 in terms of a power feeding method with regard to the patch antenna 210. A signal line 221 supplies a signal to the patch antenna 210 using a coupling feeding method. To this end, a coupling opening 280 is formed in the grounding layers 230.

Figure 6:
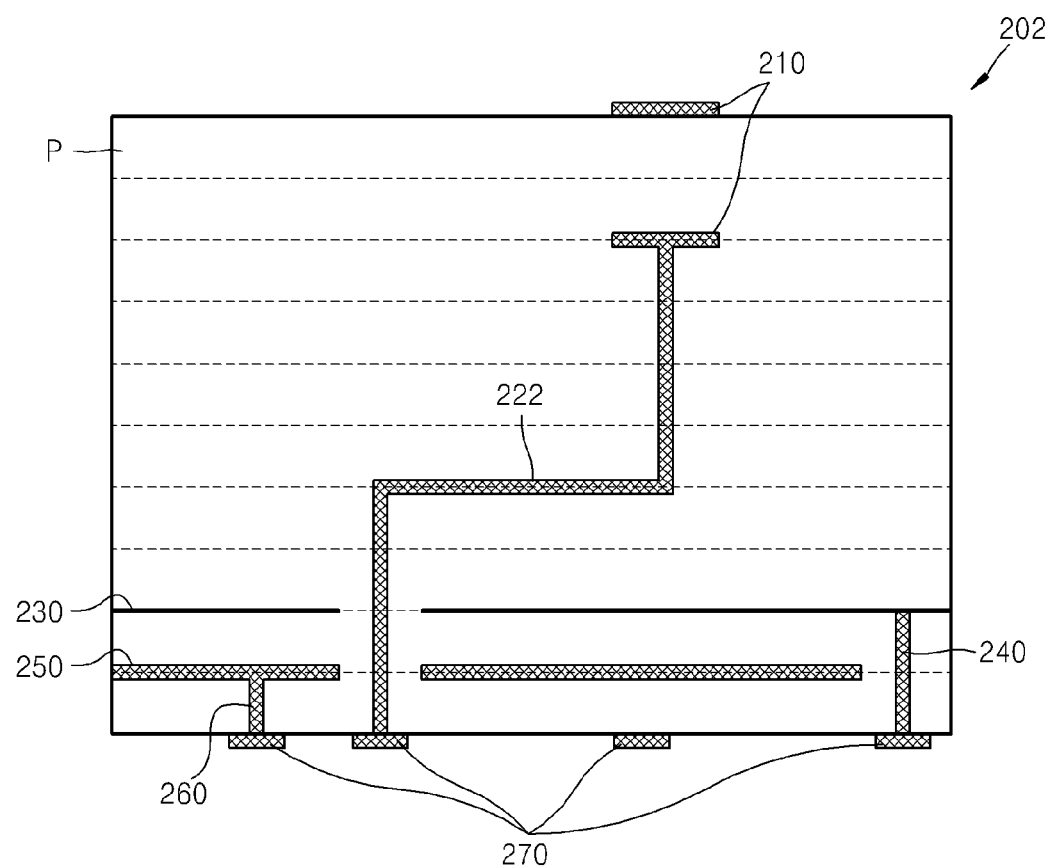
FIG. 6 is a cross-sectional view illustrating a specific configuration of a PCB unit applied to the antenna-PCB package of FIG. 1 according to another exemplary embodiment.

FIG. 6 is a cross-sectional view illustrating a specific configuration of a PCB unit applied to the antenna-PCB package of FIG. 1 according to another exemplary embodiment.

The PCB unit 202 according to the current exemplary embodiment is different from the PCB unit 200 of FIG. 1 in that a signal line 222 is formed to have a microstrip structure. Using the signal line 222 and the grounding layers 230 disposed under the signal line 222, a signal is transmitted in a quasi-TEM mode.

Figure 7:
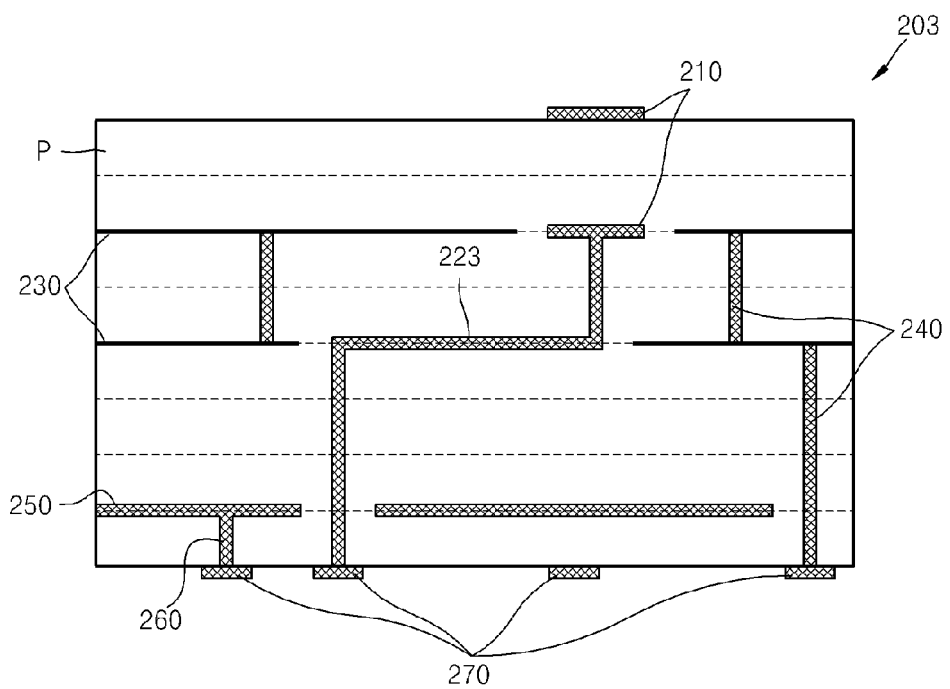
FIG. 7 is a cross-sectional view illustrating a specific configuration of a PCB unit applied to the antenna-PCB package of FIG. 1 according to another exemplary embodiment.

FIG. 7 is a cross-sectional view illustrating a specific configuration of a PCB unit applied to the antenna-PCB package of FIG. 1 according to another exemplary embodiment.

The PCB unit 203 according to the current exemplary embodiment is different from other PCB units of the previous exemplary embodiments in that a signal line 223 has an embedded coplanar waveguide (CPW) line structure. The grounding layers 230 and the signal line 223 are disposed on the same plane. While a signal is not transmitted in a TEM mode of a typical coplanar transmission line structure, in the embedded CPW line structure, wirings such as an antenna and a power line disposed on and under the signal line 223 function as a shield to thereby allow signal transmission in a TEM mode.

Figure 8:
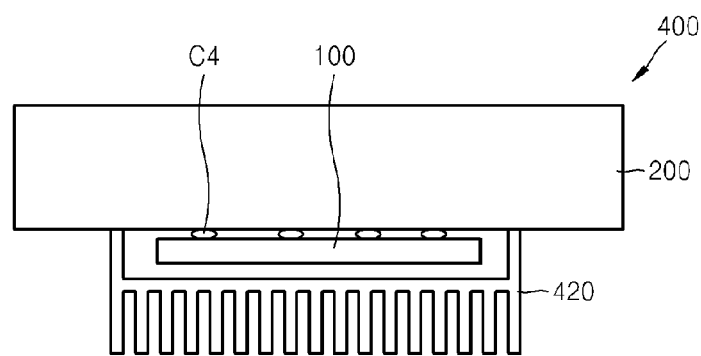
FIG. 8 is a schematic cross-sectional view of an antenna-PCB package according to another exemplary embodiment.

FIG. 8 is a cross-sectional view illustrating an antenna-PCB package according to another exemplary embodiment.

The antenna-PCB package 400 according to the current exemplary embodiment is different from the antenna-PCB package 300 of FIG. 1 in that a heat sink 420 bonded to a lower surface of the PCB unit 200 is further included. The heat sink 420 may be bonded to a surface on which the RFIC chip 100 is bonded. The heat sink 420 may be formed of a metal having good thermal conductivity, and may include a plurality of heat dissipation pins to increase heat radiation efficiency as illustrated in FIG. 8. However, the form of the heat sink 420 is not limited to that illustrated in FIG. 8.

According to the antenna-PCB package of the exemplary embodiments, a single package structure in which an antenna is included in a PCB is used, thereby omitting assembly and bonding processes between the antenna and the PCB and reducing the size of the package.

In addition, since the antenna and the PCB are formed of a same material, the antenna-PCB package is manufactured cost-effectively.

The arrangement of the antenna, the signal line, and the power line mounted in the PCB is described in detail about, but these descriptions are only examples, and thus the arrangement positions or forms of wirings may be modified variously.

While exemplary embodiments have been particularly shown and described, it will be understood by those of ordinary skill in the art that various changes in form and details may be made therein without departing from the spirit and scope of the inventive concept as defined by the following claims.

What is claimed is:

1. An antenna-printed circuit board (PCB) package comprising:
   a PCB including a plurality of conductive plates and dielectric layers, the plurality of conductive plates being electrically separated by dielectric layers therebetween;
   an antenna portion including at least two planar pattern layers configured to irradiate a wireless signal, wherein one of the two layers is on a first surface of the PCB, the first surface being an outmost surface of the PCB, and the other of the two layers is inside the PCB, and the at least two planar pattern layers are stacked to overlap each other;
   a radio frequency integrated circuit (RFIC) chip bonded to a second surface of the PCB opposite to the first surface, the second surface being another outmost surface of the PCB; and
   a signal line configured to transmit a signal be irradiated by the antenna portion from the RFIC chip to the antenna portion,
   wherein the signal line is fed to the other of the two layers that is inside the PCB and is not fed to the one of the two layers that s on the first surface of the PCB.

2. The antenna-PCB package of claim 1, wherein the antenna portion is configured to irradiate a millimeter wave signal.

3. The antenna-PCB package of claim 2, wherein the antenna portion comprises a patch antenna.

4. The antenna-PCB package of claim 1, wherein a signal from the RFIC chip is supplied through the signal line to the antenna portion using a direct feeding method.

5. The antenna-PCB package of claim 1, wherein a signal from the RFIC chip is supplied to the antenna portion through the signal line using a coupling feeding method.

6. The antenna-PCB package of claim 1, wherein the signal line has a stripline structure.

7. The antenna-PCB package of claim 1, wherein the signal line has a microstrip structure.

8. The antenna-PCB package of claim 1, wherein the signal line has an embedded coplanar waveguide (CPW) line structure.

9. The antenna-PCB package of claim 1, further comprising a plurality of RFIC bonding pads formed on the second surface of the PCB, and wherein the RFIC is bonded to the PCB using the bonding pads.

10. The antenna-PCB package of claim 9, wherein the RFIC chip is bonded to the RFIC bonding pads using a flip-chip bonding method or a wire bonding method.

11. The antenna-PCB package of claim 10, wherein the RFIC chip is bonded to the RFIC bonding pads using a flip chip bonding method by using C4.

12. The antenna-PCB package of claim 9, wherein a power line for supplying power to the RFIC chip is formed in the PCB.

13. The antenna-PCB package of claim 12, further comprising a conductive via that electrically connects the power line and one of the plurality of RFIC bonding pads.

14. The antenna-PCB package of claim 1, wherein a plurality of grounding layers and at least one ground via that connects the plurality of grounding layers are formed in the PCB.

15. The antenna-PCB package of claim 1, wherein the PCB comprises an FR4 material.

16. The antenna-PCB package of claim 1, further comprising a heat sink bonded to the PCB.

17. The antenna-PCB package of claim 1, wherein the one of the two planar pattern layers is electrically isolated from the other of the two planar pattern layers.

18. The antenna-PCB package of claim 1, wherein the at least two planar layers entirely overlap each other.

19. The antenna-PCB package of claim 1, wherein a connection of the signal line to the antenna is a connection of the signal line to a single internal layer of the antenna.

20. An antenna-printed circuit board (PCB) package comprising:
   a PCB comprising an antenna portion integrally formed therein, the PCB includes a plurality of conductive plates and dielectric layers, the plurality of conductive plates being electrically separated by dielectric layers therebetween;
   a radio frequency integrated circuit (RFIC) chip bonded to a first outmost surface of the PCB, and coupled to the antenna portion; and
   a signal line configured to transmit a signal to be irradiated by the antenna portion from the RFIC chip to the antenna portion,
   wherein the antenna portion comprises at least two planar pattern layers configured to irradiate a wireless signal, and one of the two layers is on a second outmost surface of the PCB and the other of the two layers is inside the PCB, and the at least two planar pattern layers are stacked to overlap each other, and
   wherein the signal line is fed to the other of the two layers that is inside the PCB and is not fed to the one of the two layers that is on the first surface of the PCB.

21. The antenna-PCB package of claim 20, wherein the antenna portion is integrally formed in the PCB without using a surface mounting method.

22. An antenna-printed circuit board (PCB) package for millimeter wave transmission, the antenna-PCB package comprising:
   a PCB comprising an antenna portion integrally formed therein, the antenna portion configured to communicate a millimeter wave signal;
   a radio frequency integrated circuit (RFIC) chip bonded to a first outmost surface of the PCB and coupled to the antenna portion; and a signal line configured to transmit a signal to be irradiated by the antenna portion from the RFIC chip to the antenna portion, wherein the antenna portion comprises at least two layers of planar pattern configured to irradiate a wireless signal, and one of the two layers is on a second outmost surface of the PCB and the other of the two layers is inside the PCB, and the at least two layers are stacked to overlap each other, wherein the PCB includes a plurality of conductive plates and dielectric layers, the plurality of conductive plates being electrically separated by dielectric layers therebetween, and wherein the signal line is fed to the other of the two layers that is inside the PCB and is not fed to the one of the two layers that is on the first surface of the PCB.

23. The PCB package of claim 22, the antenna portion is integrally formed in the PCB without using a surface mounting method.

24. The antenna-PCB package of claim 1, wherein the antenna portion including a patch antenna and the two layers are two patch layers of the patch antenna.

25. The antenna-PCB package of claim 24, wherein the other of the two patch layers inside the PCB is connected to a signal line so a signal from the RFIC chip is supplied through a direct feeding method.

26. The antenna-PCB package of claim 24, wherein a signal from the RFIC chip is supplied to the other of the two patch layers inside the PCB using a coupling feeding method.

* * * * *